United States Patent
Chopra et al.

(10) Patent No.: US 6,652,364 B2
(45) Date of Patent: *Nov. 25, 2003

(54) METHODS AND APPARATUSES FOR MECHANICAL AND CHEMICAL-MECHANICAL PLANARIZATION OF MICROELECTRONIC-DEVICE SUBSTRATE ASSEMBLIES ON PLANARIZING PADS

(75) Inventors: Dinesh Chopra, Boise, ID (US); Scott G. Meikle, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/300,268

(22) Filed: Nov. 19, 2002

(65) Prior Publication Data

US 2003/0073388 A1 Apr. 17, 2003

Related U.S. Application Data

(62) Division of application No. 09/854,390, filed on May 11, 2001, which is a continuation of application No. 09/164,915, filed on Oct. 1, 1998, now Pat. No. 6,250,994.

(51) Int. Cl.[7] .............................................. B24B 53/00
(52) U.S. Cl. .................. 451/56; 451/288; 451/443; 451/444; 451/451; 451/456
(58) Field of Search .................. 451/288, 56, 443, 451/444, 451, 456

(56) References Cited

U.S. PATENT DOCUMENTS

| | | | | |
|---|---|---|---|---|
| 5,707,492 A | * | 1/1998 | Stager et al. | 438/693 |
| 5,709,593 A | | 1/1998 | Guthrie et al. | 451/287 |
| 5,775,983 A | | 7/1998 | Shendon et al. | 451/444 |
| 5,782,675 A | | 7/1998 | Southwick | 451/56 |
| 5,827,781 A | | 10/1998 | Skrovan et al. | 438/692 |
| 5,836,806 A | | 11/1998 | Cadien et al. | 451/41 |
| 5,885,137 A | | 3/1999 | Ploessl | 451/56 |
| 5,885,147 A | | 3/1999 | Kreager et al. | 451/443 |
| 5,902,173 A | | 5/1999 | Tanaka | 451/56 |
| 5,913,712 A | | 6/1999 | Molinar | 451/41 |
| 5,916,010 A | | 6/1999 | Varian et al. | 451/38 |
| 5,941,762 A | | 8/1999 | Ravkin et al. | 451/56 |
| 5,945,346 A | | 8/1999 | Vanell et al. | 438/691 |
| 5,961,377 A | | 10/1999 | Jeong | 451/56 |
| 5,968,843 A | | 10/1999 | Dawson et al. | 438/693 |
| 6,022,266 A | | 2/2000 | Bullard et al. | 451/56 |
| 6,051,495 A | | 4/2000 | Burke et al. | 438/685 |
| 6,106,728 A | | 8/2000 | Iida et al. | 210/743 |

(List continued on next page.)

Primary Examiner—William Hong
(74) Attorney, Agent, or Firm—Dorsey & Whitney LLP

(57) ABSTRACT

Apparatuses and methods for planarizing a microelectronic-device substrate assembly on a planarizing pad. In one aspect of the invention, material is removed from the substrate assembly by pressing the substrate assembly against a planarizing surface of a planarizing pad and moving the substrate assembly across the planarizing surface through a planarizing zone. The method also includes replacing at least a portion of a used volume of planarizing solution on the planarizing surface with fresh planarizing solution during the planarization cycle of a single substrate assembly. The used planarizing solution can be replaced with fresh planarizing solution by actively removing the used planarizing solution from the pad with a removing unit and depositing fresh planarizing solution onto the pad in the planarizing zone. The used planarizing solution, for example, can be removed either while the substrate assembly is moved through the planarizing zone, or between planarizing stages of a multi-stage planarizing process. In another aspect of the invention, a planarizing machine for planarizing microelectronic-device substrate assemblies includes removing unit at the accumulation zone to actively remove used planarizing solution from the accumulation zone on the stationary planarizing pad.

15 Claims, 7 Drawing Sheets

U.S. PATENT DOCUMENTS

| | | | |
|---|---|---|---|
| 6,123,607 A | 9/2000 | Ravkin et al. | 451/56 |
| 6,135,868 A | 10/2000 | Brown et al. | 451/443 |
| 6,159,076 A | 12/2000 | Sun et al. | 451/36 |
| 6,190,236 B1 | 2/2001 | Drill | 451/41 |
| 6,217,416 B1 | 4/2001 | Kaufman et al. | 451/41 |
| 6,241,587 B1 | 6/2001 | Drill et al. | 451/56 |
| 6,250,994 B1 | 6/2001 | Chopra et al. | 451/56 |
| 6,340,434 B1 | 1/2002 | Mizuno et al. | 216/38 |
| 6,371,838 B1 | 4/2002 | Holzapfel | 451/72 |
| 6,379,230 B1 | 4/2002 | Hayashi et al. | 451/292 |
| 6,561,878 B2 | 5/2003 | Chopra et al. | 451/56 |

\* cited by examiner

METHODS AND APPARATUSES FOR MECHANICAL AND CHEMICAL-MECHANICAL PLANARIZATION OF MICROELECTRONIC-DEVICE SUBSTRATE ASSEMBLIES ON PLANARIZING PADS

CROSS-REFERENCE TO RELATED APPLICATIONS

This application is divisional of pending U.S. patent application Ser. No. 09/854,390, filed May 11, 2001, which is a continuation of U.S. patent application Ser. No. 09/164,915, filed Oct. 1, 1998, issued Jun. 26, 2001 as U.S. Pat. No. 6,250,994.

TECHNICAL FIELD

The present invention relates to methods and apparatuses for planarizing microelectronic-device substrate assemblies, and to methods for mechanical and chemical-mechanical planarization of such substrate assemblies on planarizing pads.

BACKGROUND OF THE INVENTION

Mechanical and chemical-mechanical planarizing processes ("CMP") are used in the manufacturing of electronic devices for forming a flat surface on semiconductor wafers, field emission displays and many other microelectronic-device substrate assemblies. CMP processes generally remove material from a substrate assembly to create a highly planar surface at a precise elevation in the layers of material on the substrate assembly.

FIG. 1 schematically illustrates an existing web-format planarizing machine 10 for planarizing a substrate 12. The planarizing machine 10 has a support table 14 with a top-panel 16 at a workstation where an operative portion (A) of a planarizing pad 40 is positioned. The top-panel 16 is generally a rigid plate to provide a flat, solid surface to which a particular section of the planarizing pad 40 may be secured during planarization.

The planarizing machine 10 also has a plurality of rollers to guide, position and hold the planarizing pad 40 over the top-panel 16. The rollers include a supply roller 20, first and second idler rollers 21a and 21b, first and second guide rollers 22a and 22b, and a take-up roller 23. The supply roller 20 carries an unused or pre-operative portion of the planarizing pad 40, and the take-up roller 23 carries a used or post-operative portion of the planarizing pad 40. Additionally, the first idler roller 21a and the first guide roller 22a stretch the planarizing pad 40 over the top-panel 16 to hold the planarizing pad 40 stationary during operation. A motor (not shown) drives at least one of the supply roller 20 and the take-up roller 23 to sequentially advance the planarizing pad 40 across the top-panel 16. As such, clean pre-operative sections of the planarizing pad 40 may be quickly substituted for used sections to provide a consistent surface for planarizing and/or cleaning the substrate 12.

The web-format planarizing machine 10 also has a carrier assembly 30 that controls and protects the substrate 12 during planarization. The carrier assembly 30 generally has a substrate holder 32 to pick up, hold and release the substrate 12 at appropriate stages of the planarizing cycle. A plurality of nozzles 33 attached to the substrate holder 32 dispense a planarizing solution 44 onto a planarizing surface 42 of the planarizing pad 40. The carrier assembly 30 also generally has a support gantry 34 carrying a drive assembly 35 that translates along the gantry 34. The drive assembly 35 generally has an actuator 36, a drive shaft 37 coupled to the actuator 36, and an arm 38 projecting from the drive shaft 37. The arm 38 carries the substrate holder 32 via another shaft 39 such that the drive assembly 35 orbits the substrate holder 32 about an axis B—B offset from a center point C—C the substrate 12.

The planarizing pad 40 and the planarizing solution 44 define a planarizing medium that mechanically and/or chemically-mechanically removes material from the surface of the substrate 12. The planarizing pad 40 used in the web-format planarizing machine 10 is typically a fixed-abrasive planarizing pad in which abrasive particles are fixedly bonded to a suspension material. In fixed-abrasive applications, the planarizing solution is a "clean solution" without abrasive particles because the abrasive particles are fixedly distributed across the planarizing surface 42 of the planarizing pad 40. In other applications, the planarizing pad 40 may be a non-abrasive pad without abrasive particles composed of a polymeric material (e.g., polyurethane) or other suitable materials. The planarizing solutions 44 used with the non-abrasive planarizing pads are typically CMP slurries with abrasive particles and chemicals to remove material from a substrate.

To planarize the substrate 12 with the planarizing machine 10, the carrier assembly 30 presses the substrate 12 against the planarizing surface 42 of the planarizing pad 40 in the presence of the planarizing solution 44. The drive assembly 35 then orbits the substrate holder 32 about the offset axis B—B to translate the substrate 12 across the planarizing surface 42. As a result, the abrasive particles and/or the chemicals in the planarizing medium remove material from the surface of the substrate 12.

CMP processes should consistently and accurately produce a uniformly planar surface on the substrate assembly to enable precise fabrication of circuits and photo-patterns. During the fabrication of transistors, contacts, interconnects and other features, many substrate assemblies develop large "step heights" that create a highly topographic surface across the substrate assembly. Yet, as the density of integrated circuits increases, it is necessary to have a planar substrate surface at several stages of processing the substrate assembly because non-uniform substrate surfaces significantly increase the difficulty of forming sub-micron features. For example, it is difficult to accurately focus photo-patterns to within tolerances approaching 0.1 $\mu$m on non-uniform substrate surfaces because sub-micron photolithographic equipment generally has a very limited depth of field. Thus, CMP processes are often used to transform a topographical substrate surface into a highly uniform, planar substrate surface.

In the competitive semiconductor industry, it is also highly desirable to have a high yield in CMP processes by quickly producing a uniformly planar surface at a desired endpoint on a substrate assembly. For example, when a conductive layer on a substrate assembly is under-planarized in the formation of contacts or interconnects, many of these components may not be electrically isolated from one another because undesirable portions of the conductive layer may remain on the substrate assembly over a dielectric layer. Additionally, when a substrate assembly is over planarized, components below the desired endpoint may be damaged or completely destroyed. Thus, to provide a high yield of operable microelectronic devices, CMP processing should quickly remove material until the desired endpoint is reached.

The web-format machine 10 produces good results in applications that use a stationary planarizing pad 40 and orbit the substrate assembly 12 about the offset axis B—B. One problem of CMP processing that the planarizing machine 10 addresses is the center-to-edge planarizing profile produced by conventional planarizing machines that have a rotating platen and a substrate holder that rotates about the center point of the substrate. In conventional rotating platen machines, the rotation of both the planarizing pad and the substrate holder causes the relative velocity between the substrate assembly and the pad to be consistently higher at the perimeter of the substrate assembly than the center. The polishing rate accordingly varies from the center of the substrate assembly to the perimeter causing a center-to-edge planarizing profile. The web-format machine 10 reduces the center-to-edge planarizing profile by orbiting the substrate holder 32 about the offset axis B—B and holding the planarizing pad 40 stationary to reduce the difference in relative velocity between the substrate assembly 12 and the pad 40 across the surface of the substrate assembly 12.

The web-format planarizing machine 10 also produces highly planar surfaces when substrate assemblies are planarized on a fixed-abrasive planarizing pad 40 and a "clean" planarizing solution 44, i.e., a planarizing solution without abrasive particles. Because the abrasive particles are fixedly bonded to the pad 40, the particles cannot agglomerate in the planarizing solution or accumulate on the planarizing surface in waste matter accumulations. The fixed distribution of abrasive particles on the pad also provides a desired distribution of abrasive particles under the substrate assembly that is not a function of the distribution of the planarizing solution under the substrate assembly. Thus, the planarizing machine 10 is particularly useful in applications that orbit a substrate across a stationary fixed-abrasive pad in the presence of a clean planarizing solution.

Although the web-format planarizing machine 10 is particularly useful for fixed-abrasive applications with clean planarizing solutions, it may also be desirable to use the web-format machine 10 with non-abrasive planarizing pads and slurries having abrasive particles. One reason for using the planarizing machine 10 with non-abrasive pads and abrasive slurries is that fixed-abrasive planarizing pads and clean planarizing solutions may not be available for the structures and chemistries required for many CMP applications. For example, fixed-abrasive pads and clean solutions used to planarize a metal layer of aluminum, copper, tungsten, or titanium in the formation of highly conductive interconnects are not widely available for the web-format machine 10. Thus, many CMP applications may require the use of web-format machines 10 with non-abrasive pads and abrasive slurries.

One drawback of CMP, and particularly the planarizing machine 10, is that it is difficult to planarize metal layers using non-abrasive pads and abrasive slurries. CMP of metal layers generally involves oxidizing the surface of the metal layer with oxidants in the slurry, and removing the oxidized metal ions from the metal layer with the abrasive particles in the slurry. The metal ions removed from the substrate 12, however, may become reattached to the substrate 12 where they can create current leakage paths or other defects. In applications with high ionization rates or in which the slurry accumulates on the polishing pad, the likelihood that metal ions will reattach to the substrate surface increases because the concentration of metal ions in the slurry increases. Thus, planarizing metal layers using the web-format planarizing machine 10 or machines having slow moving polishing pads may cause significant defects that reduce the yield of operable microelectronic devices.

Another drawback of planarizing substrate assemblies using non-abrasive pads and abrasive slurries is that the abrasive particles may accumulate on the pad or agglomerate in the slurry. These problems are particularly present when planarizing metal layers on the stationary pad of the web-format planarizing machine 10. The accumulations of abrasive particles on the planarizing pad 40 typically alter the abrasiveness of the planarizing pad, and thus they also alter the consistency of the polishing rate across the planarizing pad. Additionally, the agglomerations of the abrasive particles in the slurry may alter the abrasiveness of the slurry. In extreme cases, the agglomerations of the abrasive particles in the slurry may scratch the surface of the substrate 12. Therefore, the web-format planarizing machine 10 may not produce sufficiently planar substrate assemblies and/or may produce defects in the substrate assemblies when planarizing metal layers with non-abrasive planarizing pads and abrasive slurries.

SUMMARY OF THE INVENTION

The present invention is directed toward apparatuses and methods for planarizing a microelectronic-device substrate assembly on a planarizing pad. In one aspect of the invention, material is removed from the substrate assembly by pressing the substrate assembly against a planarizing surface of a planarizing pad and moving the substrate assembly across the planarizing surface through a planarizing zone. The method also includes replacing at least a portion of a used volume of planarizing solution on the planarizing surface with fresh planarizing solution during the planarization cycle of a single substrate assembly. The used planarizing solution can be replaced with fresh planarizing solution by actively removing the used planarizing solution from the pad with a removing unit and depositing fresh planarizing solution onto the pad in the planarizing zone. The used planarizing solution, for example, can be removed either while the substrate assembly is moved through the planarizing zone, or between planarizing stages of a multi-stage planarizing process.

In another aspect of the invention, a planarizing machine for planarizing microelectronic-device substrate assemblies includes a table with a support panel, a planarizing pad attached to the support panel to remain stationary during a planarizing cycle, and a carrier assembly having a substrate holder positionable over the planarizing pad. The planarizing pad has a planarizing surface facing away from the support panel, and the carrier assembly has a planarizing solution dispenser to dispense a fresh planarizing solution onto the planarizing surface. The carrier assembly translates the substrate assembly over the planarizing zone of the planarizing surface during a planarizing cycle, and the substrate assembly pushes used planarizing solution deposited onto the planarizing pad into one or more accumulation zones on the pad. The planarizing machine also includes a planarizing removing unit at the accumulation zone to actively remove used planarizing solution from the accumulation zone on the stationary planarizing pad.

DETAILED DESCRIPTION OF THE INVENTION

The present disclosure describes planarizing machines and methods for mechanical and/or chemical-mechanical planarizing of substrate assemblies used in the fabrication of microelectronic devices. Many specific details of certain embodiments of the invention are set forth in the following description, and in FIGS. 2–7, to provide a thorough understanding of the embodiments described herein. One skilled in the art, however, will understand that the present invention may have additional embodiments, or that the invention may be practiced without several of the details described in the following description.

Figure 1:
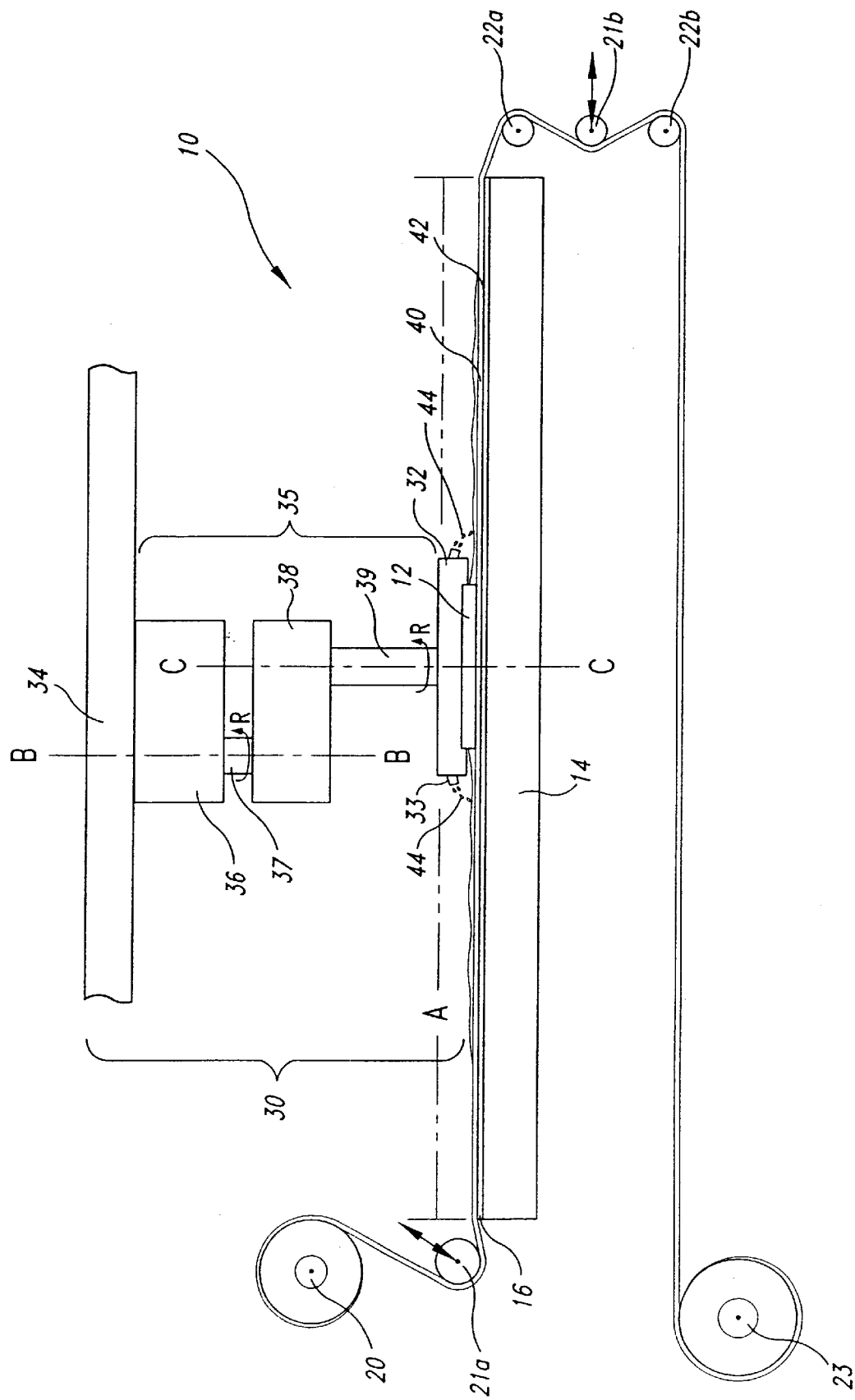
FIG. 1 is a schematic side elevational view of a web-format planarizing machine in accordance with the prior art.
Figure 2:
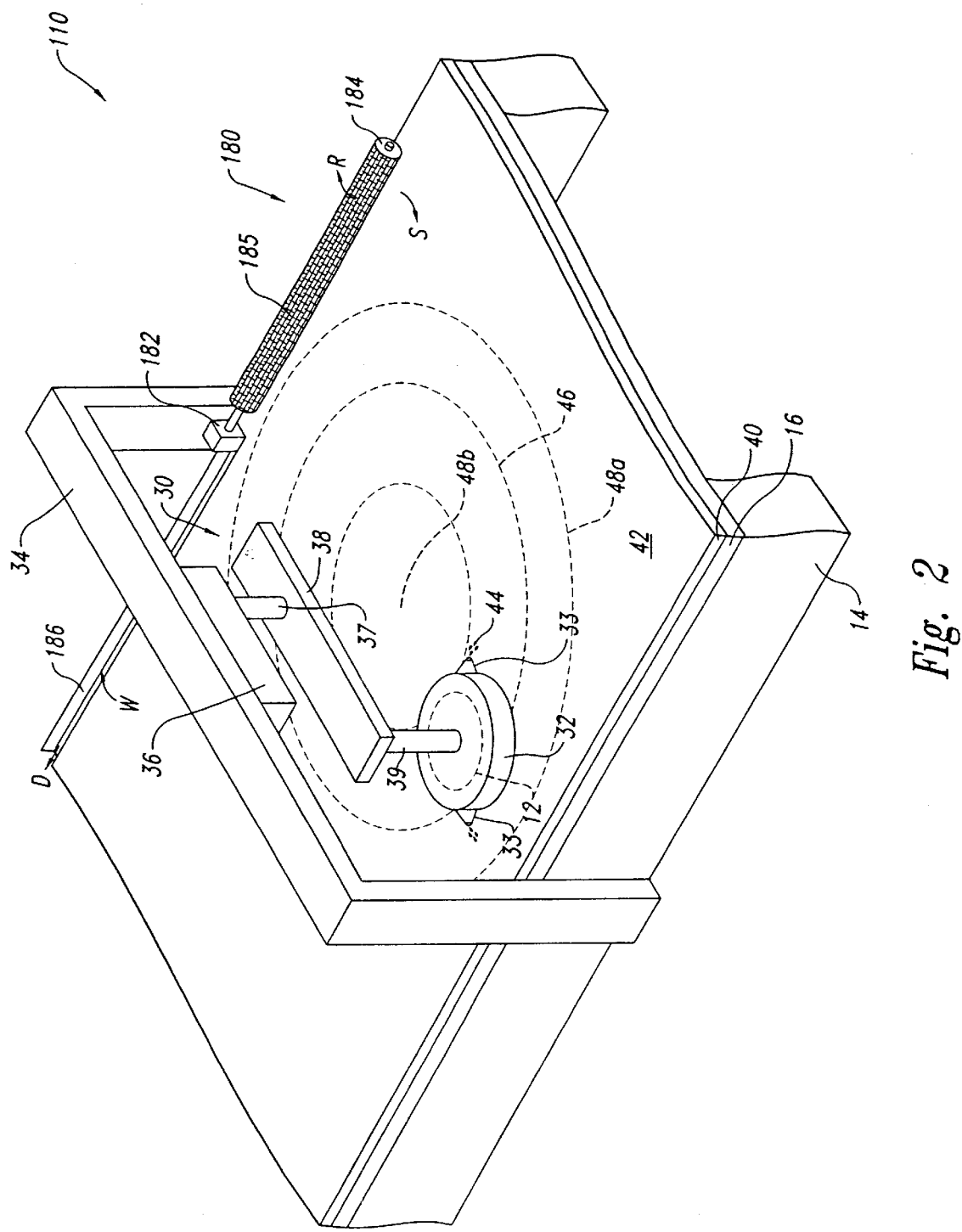
FIG. 2 is a schematic isometric view partially illustrating a web-format planarizing machine with a planarizing solution removing unit in accordance with an embodiment of the invention.

FIG. 2 is a schematic isometric view partially illustrating a web-format planarizing machine 110 for planarizing a substrate 12 in accordance with one embodiment of the invention. The planarizing machine 110 has a table 14 with a top-panel 16, a carrier assembly 30 for carrying the substrate 12, and an operative portion of a web-format planarizing pad 40 on the top-panel 16. The planarizing pad 40 also generally has pre-operative and post-operative portions wrapped around supply and take-up rollers (not shown in FIG. 2). The carrier assembly 30, the planarizing pad 40 and the supply and take-up rollers can be similar to those described above with respect to the planarizing machine 10 in FIG. 1. The planarizing pad 40 accordingly remains stationary during planarization, and a planarizing fluid 44 flows through a plurality of nozzles 33 onto the planarizing surface 42 of the planarizing pad 40. Unlike the planarizing machine 10, however, the web-format planarizing machine 110 also includes a removing unit 180 for actively removing used planarizing solution from the planarizing pad 40.

The embodiment of the removing unit 180 shown in FIG. 2 has an actuator 182 attached to the gantry 34 and a rotating brush 184 coupled to the actuator 182 The brush 184 is generally a non-abrasive brush with a plurality of bristles 185. In a preferred embodiment, the bristles 185 are approximately 0.125–0.5 inch strands of polyvinyl alcohol or other suitable materials that do not abrade or scratch the planarizing pad 40. The bristles 185 are also preferably packed together in a high density. In alternative embodiments (not shown), the brush 184 can be a fixed brush with bristles that project downward from an arm coupled to the actuator 182, or a wiper blade can be attached to the arm.

In operation, the carrier assembly 30 lifts the substrate 12 from the pad 40, and then the actuator 182 rotates the brush 184 (arrow R) and sweeps the brush 184 (arrow S) across the planarizing surface 42. The actuator 182 preferably sweeps the brush 184 across the pad 40 in a direction counter to the rotation R of the brush 184 at the planarizing surface 42. As the actuator 182 sweeps the brush 184 across the planarizing surface 42, the bristles 185 wipe used planarizing solution on the planarizing surface 42 into a trough 186 (arrow W) to remove used planarizing solution from the pad 40. The trough 186 channels the planarizing solution removed from the pad (arrow D) to a reservoir (not shown).

One method for operating the planarizing machine 110 is a multi-stage planarizing process in which a planarizing cycle of a single substrate has a first stage to remove material from the substrate 12 to an intermediate level, a cleaning stage to remove used or residual planarizing solution from the pad 40, and a second stage to remove additional material from the substrate 12 with fresh planarizing solution 44. At the first-stage of the planarizing process, the carrier assembly 30 presses the substrate 12 against planarizing surface 42 and moves the substrate 12 through a planarizing zone 46 until the surface of the substrate 12 reaches an intermediate point prior to the final desired endpoint of the substrate 12. During the first-stage of the planarizing process, an initial batch of planarizing solution 44 flows through the nozzles 33 onto the pad 40, and the substrate 12 pushes at least a portion of the initial batch of planarizing solution 44 out of the planarizing zone 46 and into outer and inner accumulation zones 48a and 48b. Since the pad 40 is stationary, a portion of the used planarizing solution 44 in the accumulation zones 48a and 48b flows back into the areas of the planarizing zone 46 that are not occupied by the substrate assembly 12. The characteristics of the planarizing solution 44 in the planarizing zone 46 accordingly change throughout the first stage of the planarizing process because residual materials from the substrate 12, the pad 40, and/or the planarizing solution 44 accumulate in the used planarization solution. Thus, the duration of the first stage of the process is generally less than the time it takes to alter the planarizing properties of the planarizing solution to a point at which the planarizing solution does not provide consistent results. To restore the planarizing solution to a suitable state, the first stage of the planarizing cycle is terminated and the used planarizing solution 44 is removed from the pad 40 by sweeping the rotating brush 184 across the planarizing surface 42, as described above.

The carrier assembly 30 then commences the second stage of the planarizing process for the substrate 12 by depositing new or additional planarizing solution 44 onto the planarizing surface 42 to replace the used planarizing solution that was removed by the brush 184. The carrier assembly 30 also translates the substrate 12 through the planarizing zone 46 in the presence of the fresh planarizing solution 44 until the final endpoint of the substrate assembly is reached. The second stage of the planarizing cycle is generally much shorter than the first stage, but the second stage may be approximately equal to the length of the first stage or even longer than the length of the first stage. Additionally, the multi-stage process for operating the planarizing machine 10 may have more than two planarizing stages and more than one cleaning stage.

Figure 3:
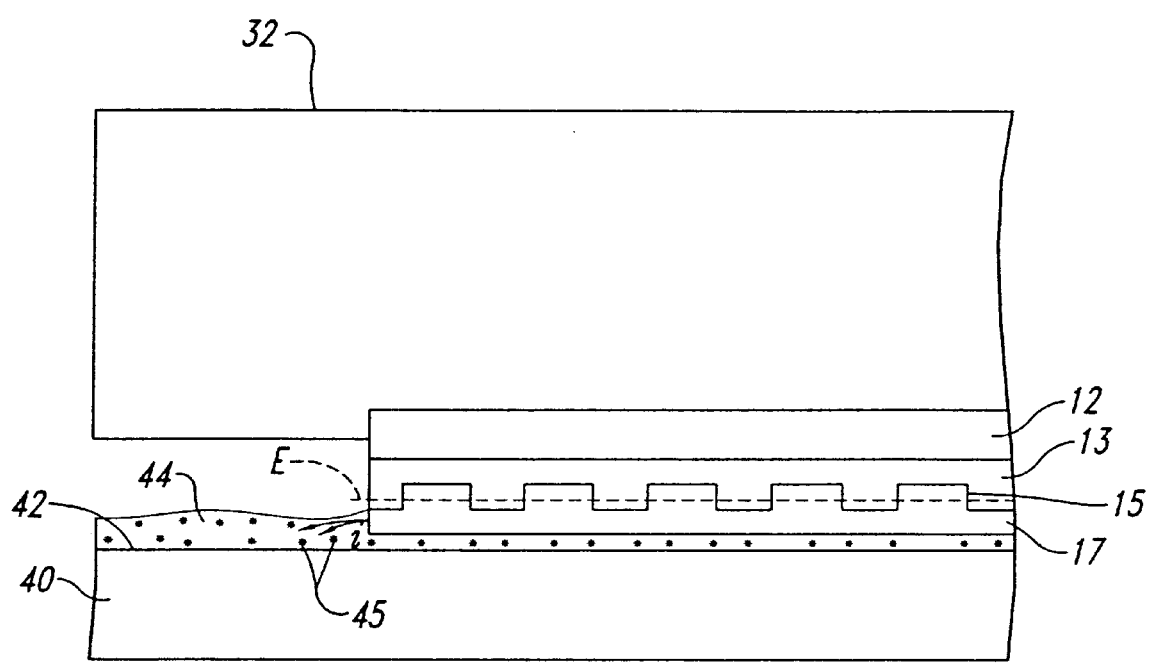
FIG. 3 is a schematic cross-sectional view partially illustrating a microelectronic-device substrate assembly being planarized at one stage of a method in accordance with an embodiment of the invention.

The planarizing machine 110 and the multi-stage planarizing process for planarizing the substrate 12 on the planarizing machine 110 are particularly well suited for forming damascene interconnect lines or other metal structures on a substrate assembly. FIG. 3 is a schematic cross-sectional view of forming damascene interconnect lines on the substrate 12 during the first stage of the multi-stage process described above. In this particular embodiment, the substrate 12 has a dielectric layer 13 with a plurality of grooves 15 that are filled by a metal cover layer 17. The metal cover layer 17 can be composed of aluminum, copper, tungsten, titanium, titanium nitride or other suitable metals. When the metal layer 17 is composed of aluminum, the substrate assembly 12 is preferably planarized using either a conventional CMP slurry or a fixed-abrasive pad having alumina abrasive particles 45.

The first stage of the two-stage process involves translating the aluminum cover layer 17 of the substrate 12 across the planarizing surface 42 for approximately 60–200 seconds, and preferably for approximately 100 seconds. The planarizing solution 44 typically oxidizes the surface of the cover layer 17, and the alumina abrasive particles 45 remove the oxidized portion of the cover layer 17. The ionic form of the metal cover layer 17 accordingly enters the planarizing solution 44. As the first stage proceeds, the used planarizing solution accumulates on the pad causing the concentration of metal ions in the solution to increase. The first stage of the process, however, is terminated before the ionic strength of the planarizing solution reaches a threshold level at which the metal ions in the planarizing solution can become significantly reattached to the surface of the substrate 12. The first stage is also terminated before the ionic strength of the planarizing solution reaches a threshold at which the alumina abrasive particles accumulate on the pad 40 or significantly agglomerate in the planarizing solution 44. The used planarizing solution 44 on the planarizing pad 40 from the first stage is then removed with the brush 184, as described above with respect to FIG. 2.

The second stage of the two-stage process then commences by depositing fresh planarizing solution 44 onto the planarizing surface 42 to replace the used planarizing solution 44 with a planarizing solution having a lower ionic strength. The second stage of the process also involves moving the substrate 12 across the planarizing surface for approximately 20–60 seconds, and preferably for approximately 50 seconds. The second stage generally continues until the surface of the substrate 12 is at a final endpoint E at which the aluminum in the grooves 15 forms damascene lines that are electrically isolated from one another by the dielectric layer 13.

The planarizing machine 110 and the multi-stage method of planarizing the substrate assembly 12 provide good results for planarizing metal layers using stationary non-abrasive pads and abrasive slurries, and also with fixed-abrasive pads and clean solutions. One aspect of the invention is the recognition that metal ions removed from the substrate tend to redeposit back onto the substrate when the ionic strength of the solution increases to a threshold where the electrostatic charge between the substrate and the slurry attracts the metal ions back to the surface of the substrate. The multi-stage process maintains the ionic strength of the planarizing solution on the planarizing pad below such a threshold by removing an initial batch of used planarizing solution from the planarizing pad before the ionic strength of the solution reaches such a threshold, and then depositing a new batch of planarizing solution at a lower ionic strength to continue planarizing the substrate. The multi-stage process may accordingly have more than two stages because it may be necessary to use three or more new batches of planarizing solution on the planarizing pad to maintain the ionic strength of the planarizing solution below such a threshold level. Therefore, the planarizing machine 110 and the multi-stage process for operating the planarizing machine 110 is expected to substantially prevent redeposition or reattachment of metal ions back onto the substrate 12.

The planarizing machine 110 and the multi-stage method for operating the planarizing machine 110 also provide good results for CMP of metal layers because the ionic strength of the slurry can be maintained below the threshold level at which abrasive particles agglomerate in the slurry or accumulate on the planarizing pad. Another aspect of the invention is the recognition that the increase in the ionic strength of the planarizing solution causes the abrasive particles in the slurry to accumulate on the pad and agglomerate in the slurry. The multi-stage process for operating the planarizing machine 110 prevents the ionic strength of the planarizing solution from increasing to such a threshold. Therefore, the planarizing machine 110 and the multi-stage method for operating the planarizing machine 110 are also expected to enhance the consistency of the slurry.

Figure 4:
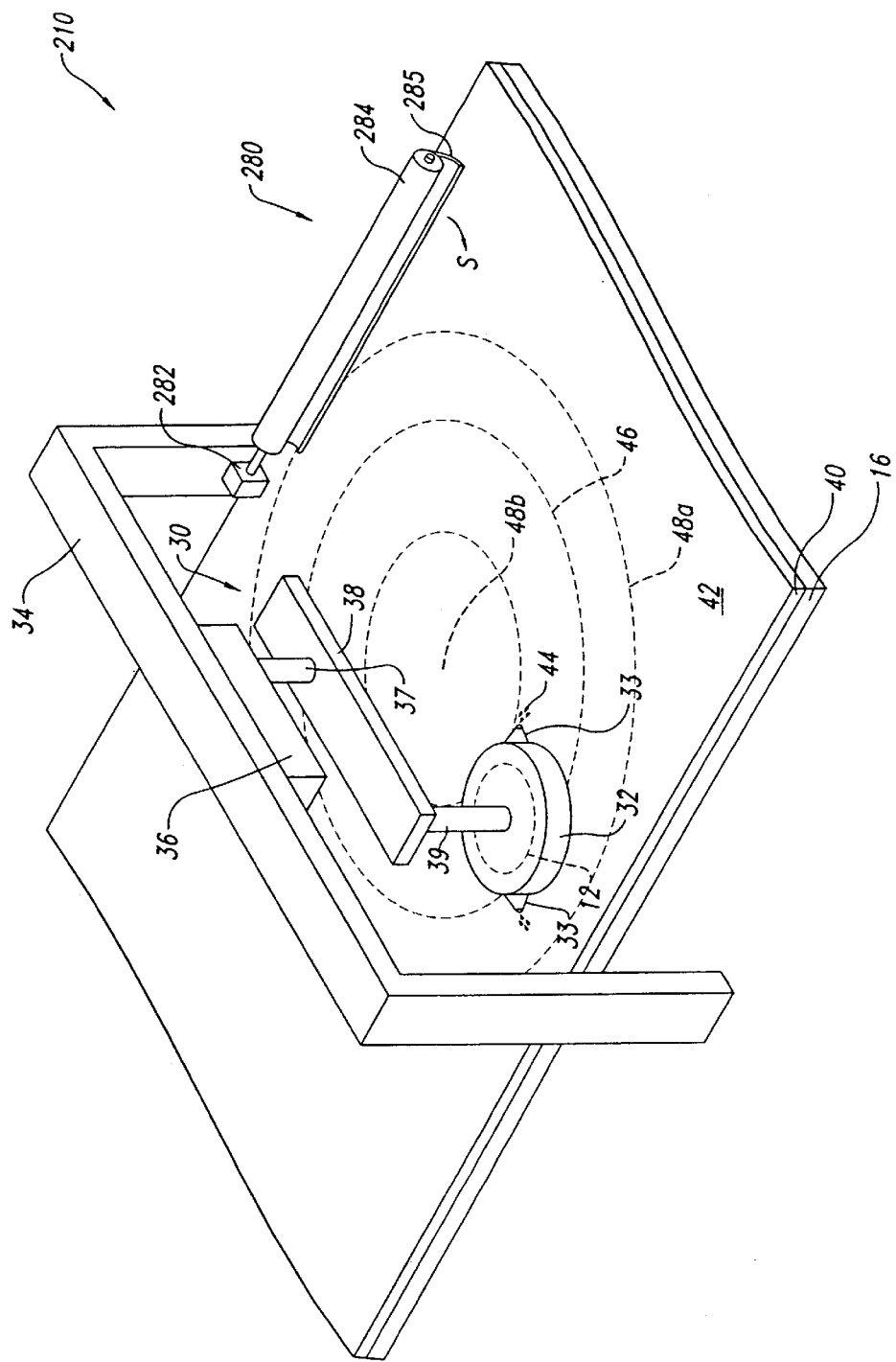
FIG. 4 is a schematic isometric view partially illustrating a web-format planarizing machine with another planarizing solution removing unit in accordance with another embodiment of the invention.

FIG. 4 is a schematic isometric view partially illustrating a planarizing machine 210 with a planarizing solution removing unit 280 for intermittently removing used planarizing solution 44 from the pad 40 in accordance with another embodiment of the invention. In this embodiment, the removing unit 280 has an actuator 282 attached to the gantry 34 and a vacuum assembly 284 coupled to the actuator 282. The vacuum assembly 284 has an elongated nozzle 285 that rests upon the planarizing surface 42. The vacuum assembly 284 can also have a vacuum source (not shown) coupled to the nozzle 285.

In operation, the actuator 282 sweeps the nozzle 285 across the planarizing surface 42 as the vacuum source draws a vacuum through the nozzle 285. The vacuum assembly accordingly sucks the used planarizing solution 44 from the pad 40. The planarizing machine 210 is preferably used between stages of a multi-stage planarizing process as described above. For example, the substrate 12 is planarized on the planarizing surface 42 to an intermediate point during a first stage, and then the carrier assembly 30 lifts the substrate assembly 12 from the planarizing surface 42 so that the vacuum assembly 284 can sweep across the planarizing surface and remove the used planarizing solution 44 from the planarizing pad 40. After the vacuum assembly 284 is cleared from the planarizing zone 46, the carrier assembly 30 reengages the substrate 12 with the planarizing surface 42 and deposits fresh planarizing solution onto the planarizing pad 40 to perform the second stage of the process in which additional material is removed from the substrate 12 to the final endpoint. It is expected that the advantages of the planarizing machine 210 with the removing unit 280 are substantially the same as those described above with respect to the planarizing machine 110 with the removing unit 180.

Figure 5:
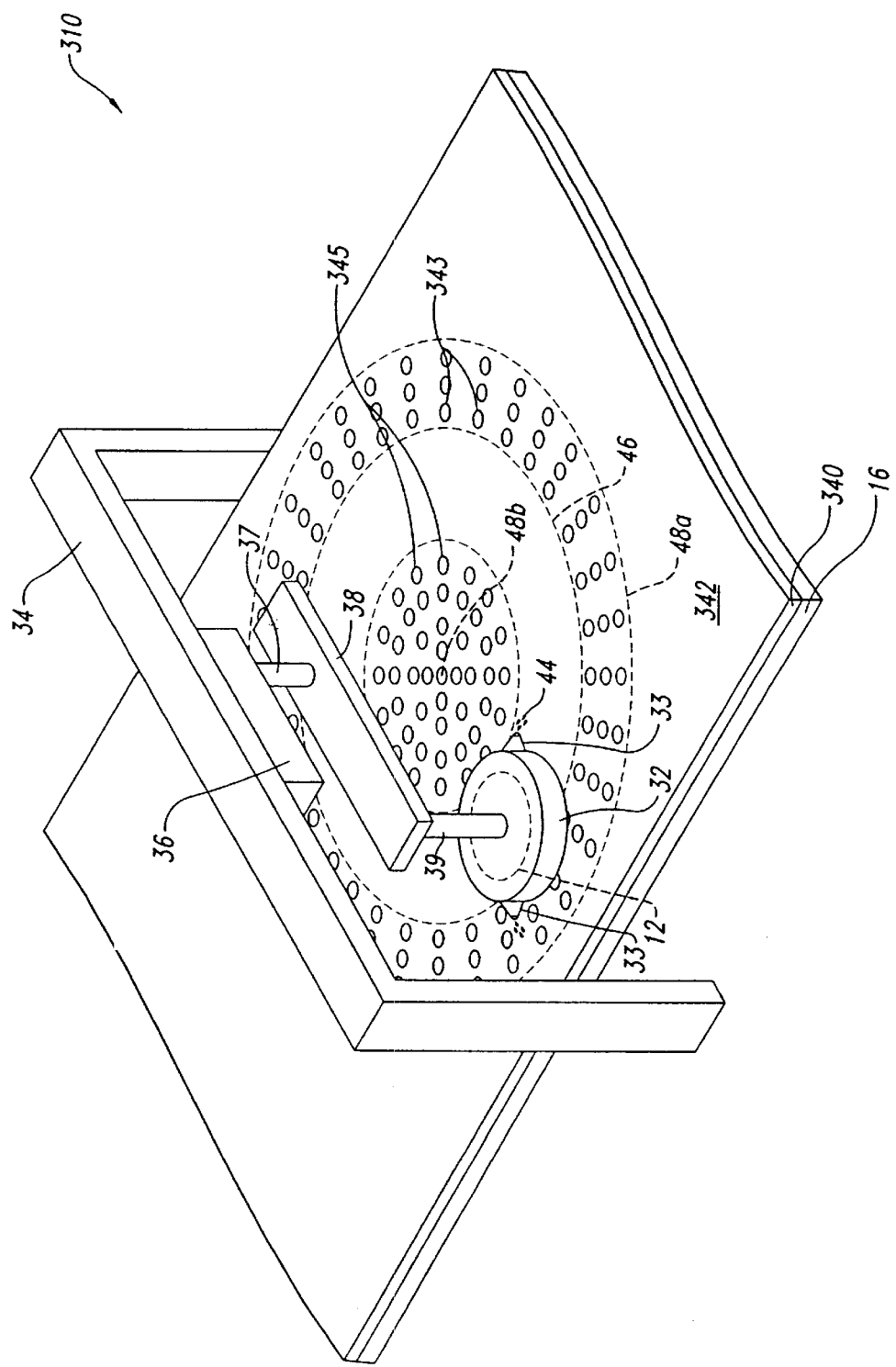
FIG. 5 is a schematic isometric view partially illustrating still another web-format planarizing machine with a continuous planarizing solution removing unit in accordance with still another embodiment of the invention.
Figure 6:
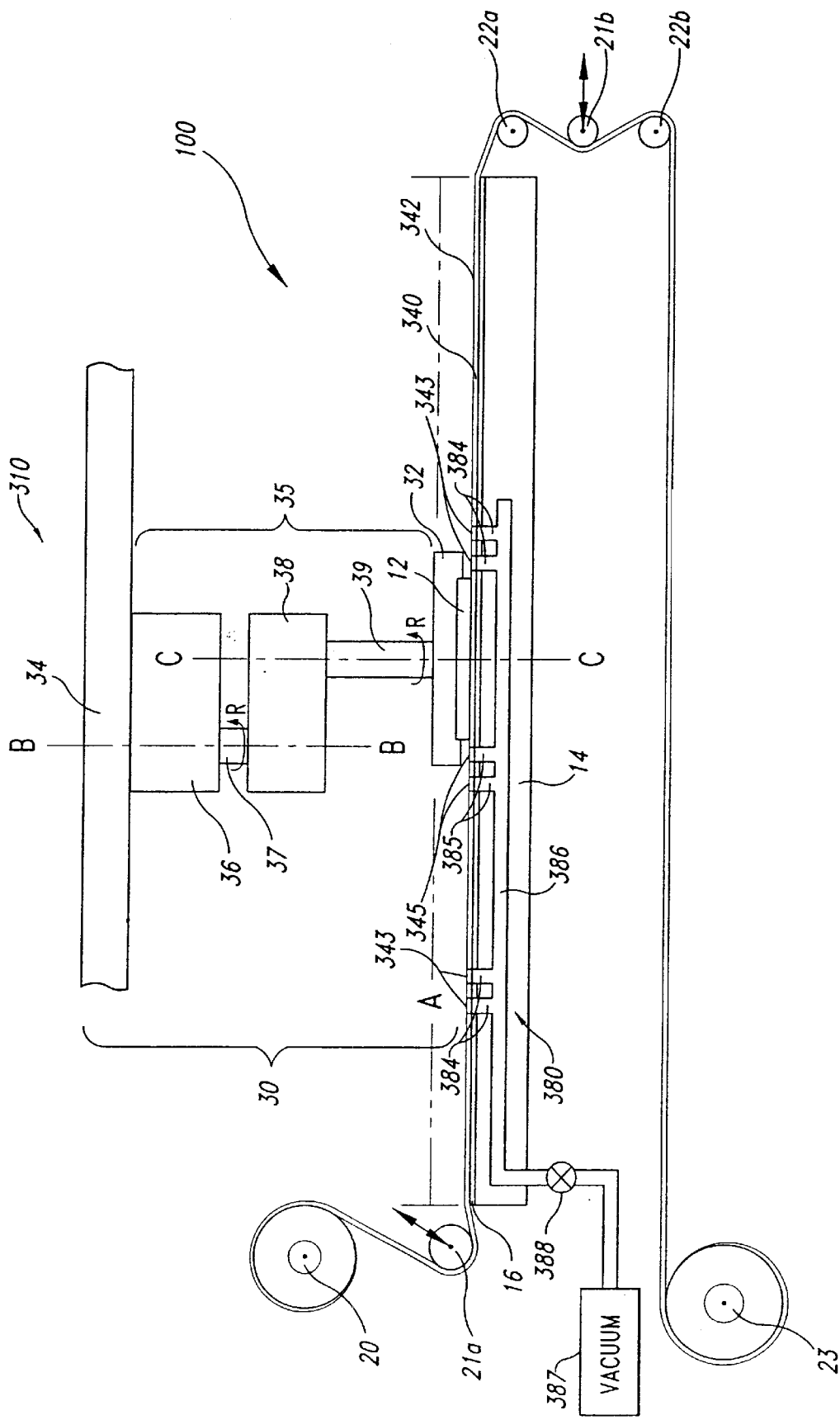
FIG. 6 is a schematic cross-sectional view of the web-format planarizing machine of FIG. 5.

FIG. 5 is a schematic isometric view partially illustrating a planarizing machine 310, and FIG. 6 is a schematic cross-sectional view of the planarizing machine 310, in accordance with another embodiment of the invention. The planarizing machine 310 has a supply roller 20, a take-up roller 23, and a carrier assembly 30 as described above. The planarizing machine 310 also has a planarizing pad 340 with a planarizing surface 342 including a plurality of holes 343 in the accumulation zone 48a. The planarizing machine 310 also has a removing unit 380 including a plurality of holes 384 in the panel 16 coupled to a common conduit 386. A vacuum source 387 can be coupled to the conduit 386 and the holes 384 via a valve 388.

The planarizing machine 310 can be operated in a multi-stage process as described above, or it can be operated in a continuous process in which used planarizing solution in the accumulation zone 48a is drawn through the holes 343 and 384 by the vacuum 387 to remove the used planarizing solution 44 from the planarizing pad while the substrate 12 is being planarized. The rate at which the removing unit 380 draws the used planarizing solution through the holes 343 is preferably controlled to maintain the planarizing characteristics of the planarizing solution at a desired level. For example, in the case of metal CMP, the carrier assembly 30 deposits fresh planarizing solution 44 and the removing unit 380 removes used planarizing solution in a manner that maintains the ionic charge of the planarizing solution on the planarizing pad 340 below the threshold at which ions significantly redeposit onto the substrate 12, or the threshold at which abrasive particles significantly agglomerate in the planarizing solution or accumulate on the planarizing pad 40.

In an alternative embodiment, the planarizing pad 340 also has a plurality of holes 345 in the inner accumulation zone 48b, and the removing unit 380 has a plurality of holes 385 under the inner accumulation zone 48b. The removing unit 380 in this embodiment accordingly removes used planarizing solution from both the outer and inner accumulation zones 48a and 48b, respectively, during planarization of the substrate 12. In still another embodiment, the planarizing pad 340 can be a porous planarizing pad without the holes 343 and 345. In this embodiment, the vacuum draws the used planarizing fluid 44 through the pores of the planarizing pad and through the holes 384 and 385 in the table 16.

The planarizing machine 310 is also expected to provide good results for CMP of metal layers and other materials because it can continuously maintain the ionic strength of the planarizing solution on the planarizing pad below the threshold at which substrate materials substantially redeposit onto the substrate, or the threshold at which abrasive particles substantially agglomerate in the planarizing solution or substantially accumulate on the planarizing pad. Additionally, the planarizing machine 310 may provide continuous planarization of the substrate 12 without interrupting the planarizing cycle to intermittently remove used planarizing solution from the pad 40. Therefore, the planarizing machine 310 is expected to enhance the planarity of the finished substrates without increasing the time for the planarizing cycles.

Figure 7:
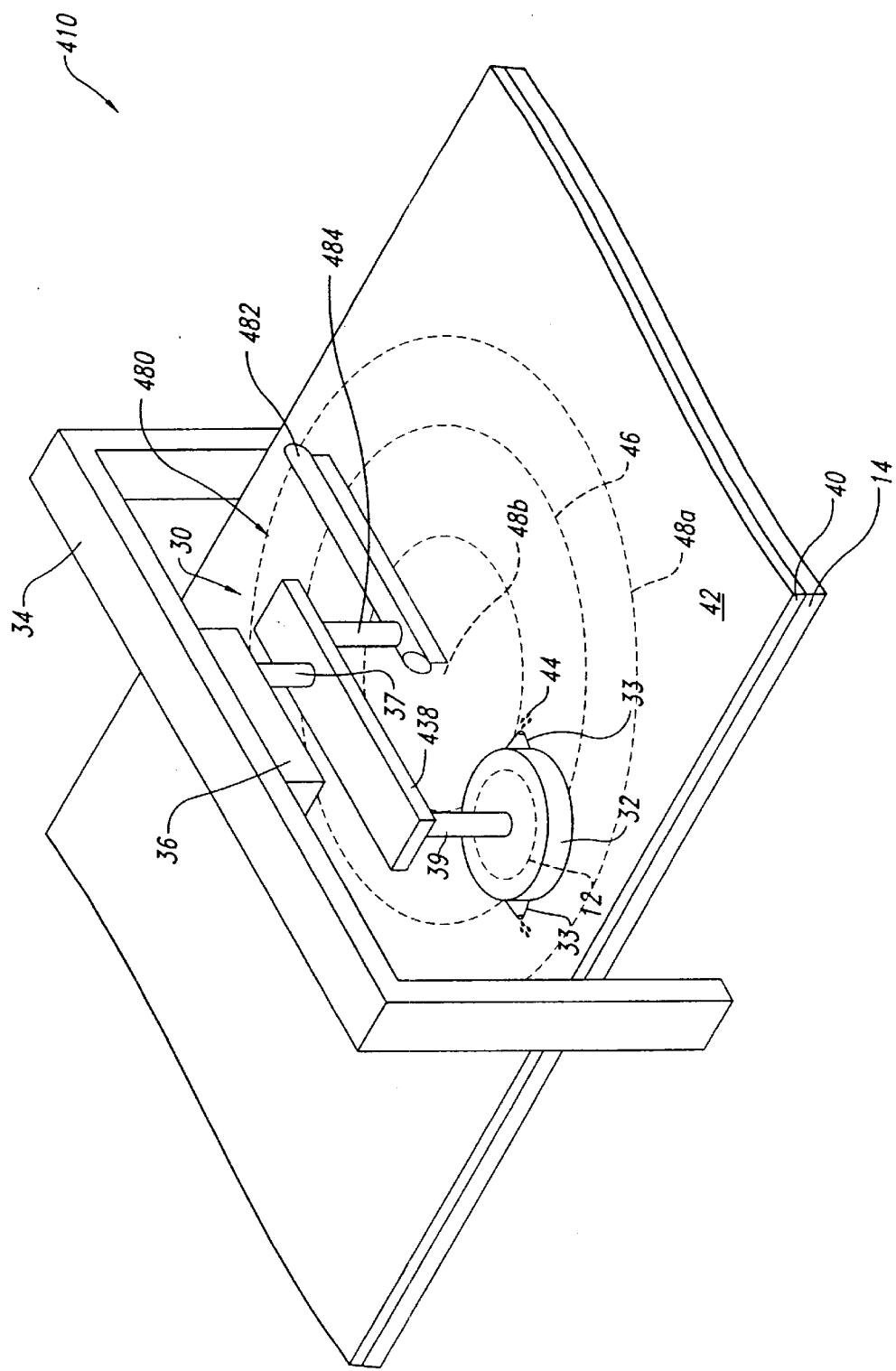
FIG. 7 is a schematic isometric view partially illustrating yet another web-format planarizing machine with another planarizing solution removing unit in accordance with another embodiment of the invention.

FIG. 7 is a schematic isometric view partially illustrating a planarizing machine 410 for continuously planarizing the substrate 12 on the planarizing pad 40 in accordance with another embodiment of the invention. The planarizing machine 410 has a continuous removing unit 480 attached to an arm 438 of the carrier assembly 30. The arm 438 is generally longer than the arm 38 shown in FIG. 2 such that the drive shaft 37 is attached to the mid-point of the arm 438. The removing unit 480 preferably has a shaft 484 attached to the arm 438 at an end opposite from the shaft 39 carrying the substrate holder 32, and a wiping element 482 extending from the shaft 484. The wiping element 482 extends transverse to the outer and inner accumulation zones 48a and 48b, and the wiping element 482 is spaced apart from the substrate 12. In one embodiment, the wiping element 482 is a rotating brush similar to that set forth above with respect to the planarizing machine 110. In another embodiment, the wiping element 482 is a vacuum assembly with a nozzle similar to that described above with respect to the planarizing machine 210. In still another embodiment, the wiping element is a wiper blade.

The planarizing machine 410 continuously removes used slurry from the planarizing pad 40 as the substrate 12 is being planarized. More particularly, the carrier assembly 30 rotates the arm 438 to translate both the wiping element 482 and the substrate 12 across the planarizing surface 42 of the pad 40. The wiping element 482 continuously removes used planarized solution 44 from at least a portion of the accumulation zones 48a and 48b as the substrate 12 passes over newly deposited planarizing solution 44 in the planarizing zone 46. Furthermore, by mounting the substrate holder 32 and the removing unit 480 at opposite ends of the arm 438, the substrate holder 32 and the removing unit 480 do not interfere with the operation of each other. The planarizing machine 410 accordingly provides good results for CMP of metal layers and other materials using stationary non-abrasive pads and abrasive slurries in a manner similar to that discussed above with respect to the planarizing machine 310.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A planarizing machine for planarizing microelectronic-device substrate assemblies, comprising:

a table with a support panel;

a planarizing pad including a planarizing surface facing away from the support panel, the planarizing pad being removably attached to the support panel;

a carrier assembly having a substrate holder positionable over the planarizing pad and a planarizing solution dispenser to dispense a fresh planarizing solution onto the planarizing surface, the substrate holder translating a substrate assembly over a planarizing zone of the planarizing surface during a planarizing cycle, and the substrate assembly pushing used planarizing solution deposited onto the planarizing pad into an accumulation zone on the planarizing surface adjacent to the planarizing zone; and a planarizing solution removing unit at the accumulation zone, the removing unit including a rotating brush attached to an actuator separate from the carrier assembly to actively remove used planarizing solution from at least a portion of the accumulation zone on the stationary planarizing pad, wherein the actuator is configured to rotate the brush about a longitudinal axis of the brush.

2. The planarizing machine of claim 1, wherein the actuator sweeps the brush over at least a portion of the accumulation zone as the brush is rotated about the longitudinal axis of the brush.

3. The planarizing machine of claim 1, wherein the removing unit includes a rotating brush having a plurality of non-abrasive bristles.

4. The planarizing machine of claim 3, wherein the rotating brush includes bristles having a length that ranges from approximately about 0.125 in. to approximately about 0.5 in.

5. The planarizing machine of claim 3, wherein the plurality of non-abrasive bristles are comprised of a polyvinyl alcohol.

6. A planarizing machine for planarizing microelectronic-device substrate assemblies, comprising:

a table;

a planarizing pad removably positioned on the table and having a planarizing surface facing away from the table;

a carrier assembly having a substrate holder positionable over the planarizing pad and a planarizing solution dispenser to dispense a fresh planarizing solution onto the planarizing surface, the substrate holder translating a substrate assembly over a planarizing zone of the planarizing surface during a planarizing cycle, and the substrate assembly pushing used planarizing solution deposited onto the planarizing pad into an accumulation zone on the planarizing surface adjacent to the planarizing zone; and a planarizing solution removing unit at the accumulation zone, the removing unit including a rotating brush attached to an actuator separate from the carrier assembly to actively remove used planarizing solution from at least a portion of the accumulation zone on the stationary planarizing pad, wherein the brush further includes a plurality of non-abrasive bristles.

7. The planarizing machine of claim 6, wherein the actuator is configured to rotate the brush about a longitudinal axis of the brush.

8. The planarizing machine of claim 6, wherein the actuator is configured to sweep the brush over at least a portion of the accumulation zone.

9. The planarizing machine of claim 6, wherein the rotating brush includes bristles having a length that ranges from approximately about 0.125 in. to approximately about 0.5 in.

10. The planarizing machine of claim 6, wherein the plurality of non-abrasive bristles are comprised of a polyvinyl alcohol.

11. A planarizing machine for planarizing microelectronic-device substrate assemblies having a planarizing pad removably attached to a table and having a planarizing surface facing away from the table, comprising:

a carrier assembly having a substrate holder positionable over the planarizing pad and a planarizing solution dispenser configured to distribute fresh planarizing solution onto the planarizing surface, the substrate holder translating a substrate assembly over a planarizing zone of the planarizing surface during a planarizing cycle to move used planarizing solution on the planarizing pad into an accumulation zone on the planarizing surface adjacent to the planarizing zone; and a planarizing solution removing unit at the accumulation zone, the removing unit including a rotating brush attached to an actuator separate from the carrier assembly to actively remove used planarizing solution from at least a portion of the accumulation zone on the stationary planarizing pad, wherein the brush further includes a plurality of non-abrasive bristles.

12. The planarizing machine of claim 11, wherein the actuator is configured to rotate the brush about a longitudinal axis of the brush.

13. The planarizing machine of claim 11, wherein the actuator is configured to sweep the brush over at least a portion of the accumulation zone.

14. The planarizing machine of claim 11, wherein the rotating brush includes bristles having a length that ranges from approximately about 0.125 in. to approximately about 0.5 in.

15. The planarizing machine of claim 11, wherein the plurality of non-abrasive bristles are comprised of a polyvinyl alcohol.

* * * * *